United States Patent [19]

Mones et al.

[11] Patent Number: 4,982,267
[45] Date of Patent: Jan. 1, 1991

[54] INTEGRATED SEMICONDUCTOR PACKAGE

[75] Inventors: Arthur H. Mones, Raleigh, N.C.; Xavier Sheehy, Park Ridge, Ill.; Richard K. Spielberger, Maple Grove, Minn.

[73] Assignee: Atmel Corporation, San Jose, Calif.

[21] Appl. No.: 48,532

[22] Filed: May 8, 1987

Related U.S. Application Data

[63] Continuation of Ser. No. 784,282, Nov. 18, 1985, abandoned, which is a continuation-in-part of Ser. No. 538,297, Oct. 3, 1983, abandoned.

[51] Int. Cl.⁵ .................... H01L 23/12; H01L 23/14; H01L 23/48
[52] U.S. Cl. ........................ 357/71; 357/80; 357/68; 357/69
[58] Field of Search ............. 357/80, 68, 74, 69, 357/71; 174/52 FP

[56] References Cited

U.S. PATENT DOCUMENTS

| | | | |
|---|---|---|---|
| 3,101,523 | 8/1963 | Henneke | 29/580 |
| 3,374,537 | 3/1968 | Doelp, Jr. | |
| 3,651,562 | 3/1972 | Hambleton | 29/473.1 |
| 3,909,929 | 10/1975 | Debesis | 29/590 |
| 4,000,508 | 12/1976 | Hager et al. | 357/61 |
| 4,074,342 | 2/1978 | Honn et al. | 357/74 |
| 4,250,520 | 2/1981 | Denlinger | 357/68 |
| 4,272,140 | 6/1981 | Lychyk et al. | 174/52 FP |
| 4,441,119 | 4/1984 | Link | 357/74 |

OTHER PUBLICATIONS

"Stacked Wafers form Dense Machine", Electronics, May 31, 1983.
Lomerson, R., "Batch-Made Packages Hold Dense ICs, Save Space, Survive Tough Environments", Electronics, Apr. 21, 1983.
Lyman, Jerry, "Packaging VL", Electronics, Dec. 29, 1981.
"Copper Plus Invar Suits Chip-Carriers", Electronics, Jun. 16, 1981.
Kraynak, P., "Wafer-Chip Assembly for Large-Scale Integration", IEEE Transactions on Electron Devices, vol. ED-15, No. 9, Sep. 1968.
Miller, L. F., "Microelectronic Device Standoffs", IBM Technical Discl. Bulletin, vol. 8, No. 3, Aug. 1965.
Bodendorf, K. T., "Active Silicon Chip Carrier", IBM Tech. Discl. Bull., vol. 15, No. 2, (Jul. 1972).
Amaro, J. M., "Integrated Circuit Packaging Structure and Process", IBM Technical Disclosure Bulletin, vol. 18, No. 9, (Feb. 1976).
McConaghy, B. W., "Hybrid Circuit Package", IBM Tech. Disclosure Bulletin, vol. 9, No. 11, (Apr. 1967).

Primary Examiner—Rolf Hille
Assistant Examiner—S. V. Clark

[57] ABSTRACT

An integrated semiconductor package comprising a semiconductor body having a first surface and a plurality of pins, each pin having first and second ends. Also disclosed is an apparatus for connecting the first end of each pin to the first surface of the semiconductor body so that the semiconductor body provides the physical integrity to support the pins above and substantially perpendicular to the first surface. The apparatus of connecting the first end of each pin to the first surface comprises a plurality of metalization interconnects. A metalization interconnect is interspaced between the first end of each pin and the first surface of the semiconductor body. The pins are arranged in an array so that the second end of each pin can be removably inserted into a pin-grid socket.

8 Claims, 3 Drawing Sheets

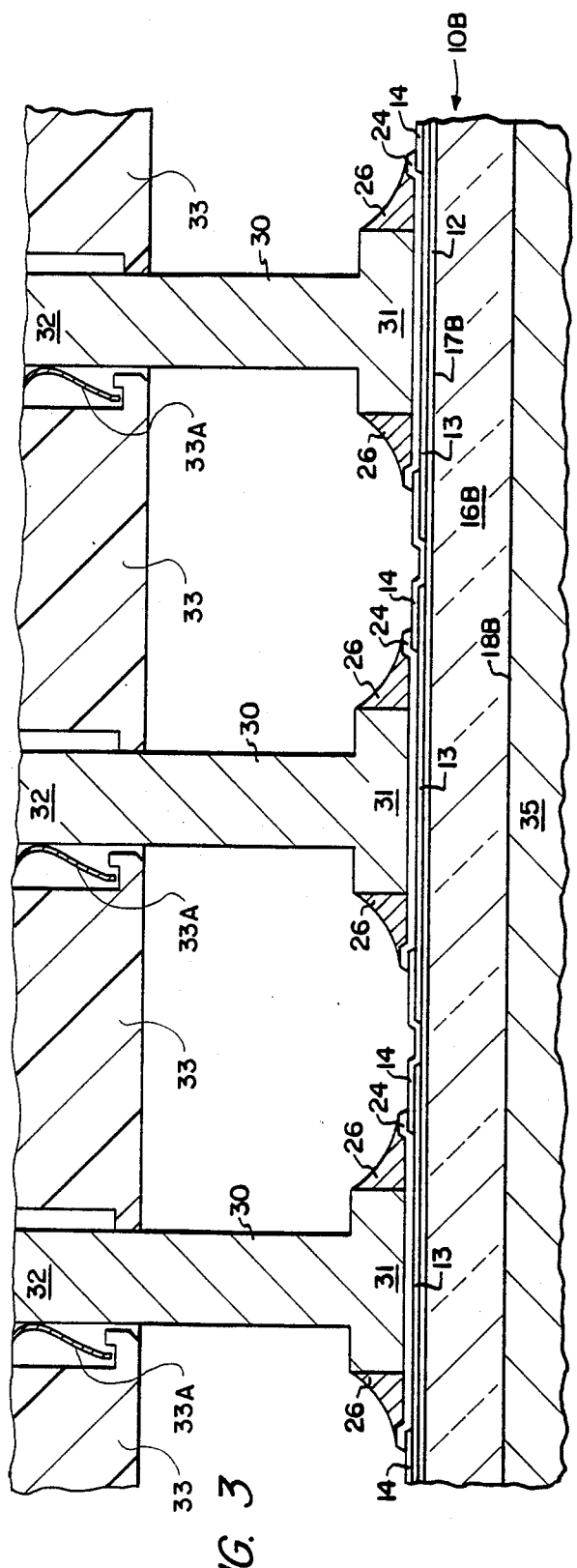
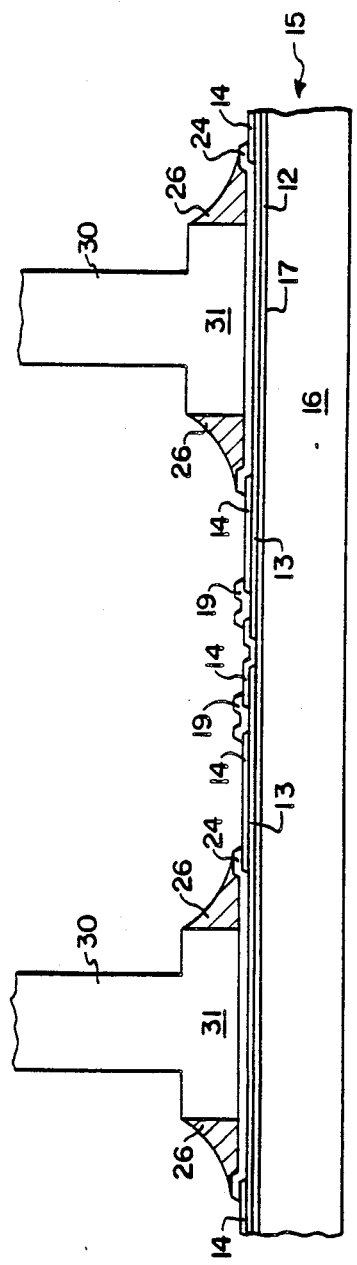

4,982,267

INTEGRATED SEMICONDUCTOR PACKAGE

This is a continuation of Ser. No. 784,782, filed Nov. 18, 1985, which is a continuation-in-part of Ser. No. 538,297 filed Oct. 3, 1983, now abandoned.

BACKGROUND OF THE INVENTION

The present invention relates to semiconductor packaging and more particularly to eliminating ceramic, plastic, or similar intermediate packages. The present invention eliminates the intermediate package typically found in the prior art. With the present invention, semiconductor chip carrier substrates and integrated circuit chips can be plugged directly into pin-grid sockets for electrical tests or end use.

The present invention provides significant advantages. For example, since the intermediate package is eliminated, electrical line length is substantially reduced, thus substantially reducing delay times within and between circuits. In addition, the present invention eliminates thermal expansion mismatch between, for example, ceramic or plastic packages and the semiconductor body. The present invention is also compatible with direct cooling of semiconductor chip carriers or substrates and integrated circuit chips.

SUMMARY OF THE INVENTION

The present invention is an integrated semiconductor package comprising a semiconductor body having a first surface and plurality of pins, each pin having first and second ends. The present invention further comprises apparatus for connecting the first end of each pin to the first surface of the semiconductor body so that the semiconductor body provides the physical integrity to support the pins above and substantially perpendicular to the first surface. The apparatus for connecting the first end of each pin to the first surface comprises a plurality of metalization interconnects. A metalization interconnect is interspaced between the first end of each pin and the first surface of the semiconductor body. The pins are arranged in an array so that the second end of each pin can be removably inserted into a pin-grid socket.

BRIEF DESCRIPTION OF THE DRAWINGS

FIG. 3 illustrates an integrated circuit chip having pins attached by their first ends to the chip in accordance with the present invention. The second end of the pins are shown mated to a pin-grid socket. The chip is shown attached to a heat sink.

FIG. 4 illustrates a semiconductor substrate having metalization interconnects adapted to be connected to an integrated circuit chip and having pins attached by their first ends to the semiconductor substrate in accordance with the present invention.

DESCRIPTION OF THE PREFERRED EMBODIMENTS

Figure 1:
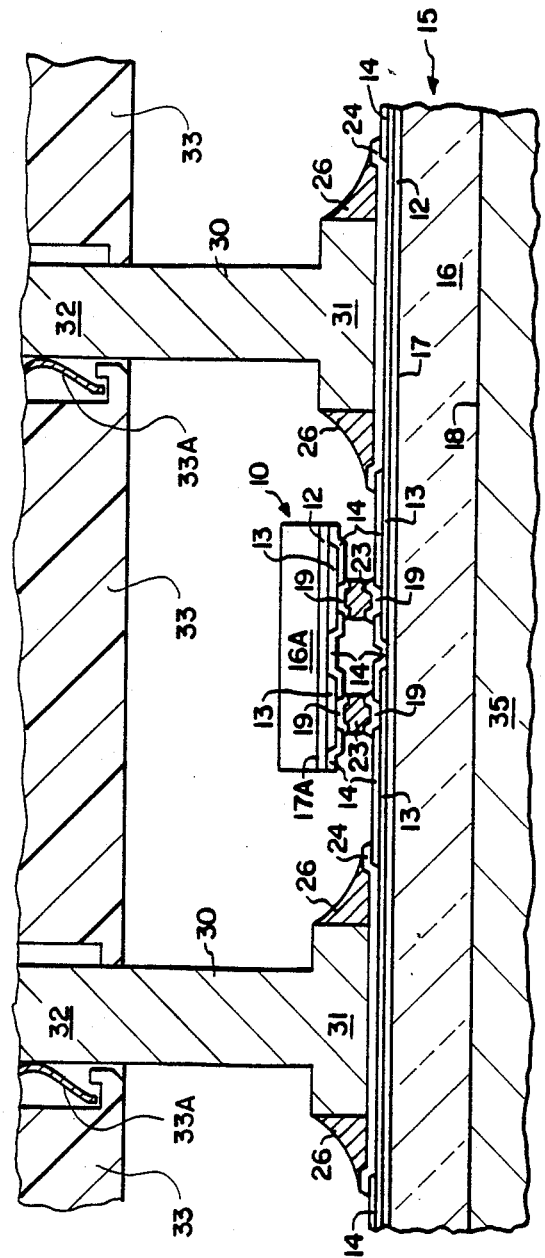
FIG. 1 illustrates a semiconductor substrate or chip carrier having an integrated circuit chip flip-chip bonded to the substrate and pins attached by their first ends to the substrate in accordance with the present invention. The second ends of the pins are shown mated to a pin-grid socket. The semiconductor substrate or chip carrier is shown attached to a heat sink.

It will be recognized by persons skilled in the art that solid state devices are frequently difficult to draw to scale because of the widely varying dimensions which occur within the elements comprising such devices. This will be become more clear when typical dimensions associated with the present invention are discussed in the present application. Accordingly, the figures are schematic in nature and typical dimensions given for the various elements shown in the figures may not be to scale in the drawings. At the same time, however, it should also be recognized that all dimensions and construction details provided in the present application are illustrative only and not to be taken as limiting the present invention.

The present invention relates to attaching terminal pins directly to a semiconductor body so that the physical integrity of the semiconductor body supports the pins above and substantially perpendicular to a surface of the semiconductor body; the pins are arranged in an array so that each pin can be removably inserted into a pin-grid socket. Therefore, as was previously indicated, the present invention eliminates intermediate packaging and the disadvantages associated with such packages.

Figure 2:
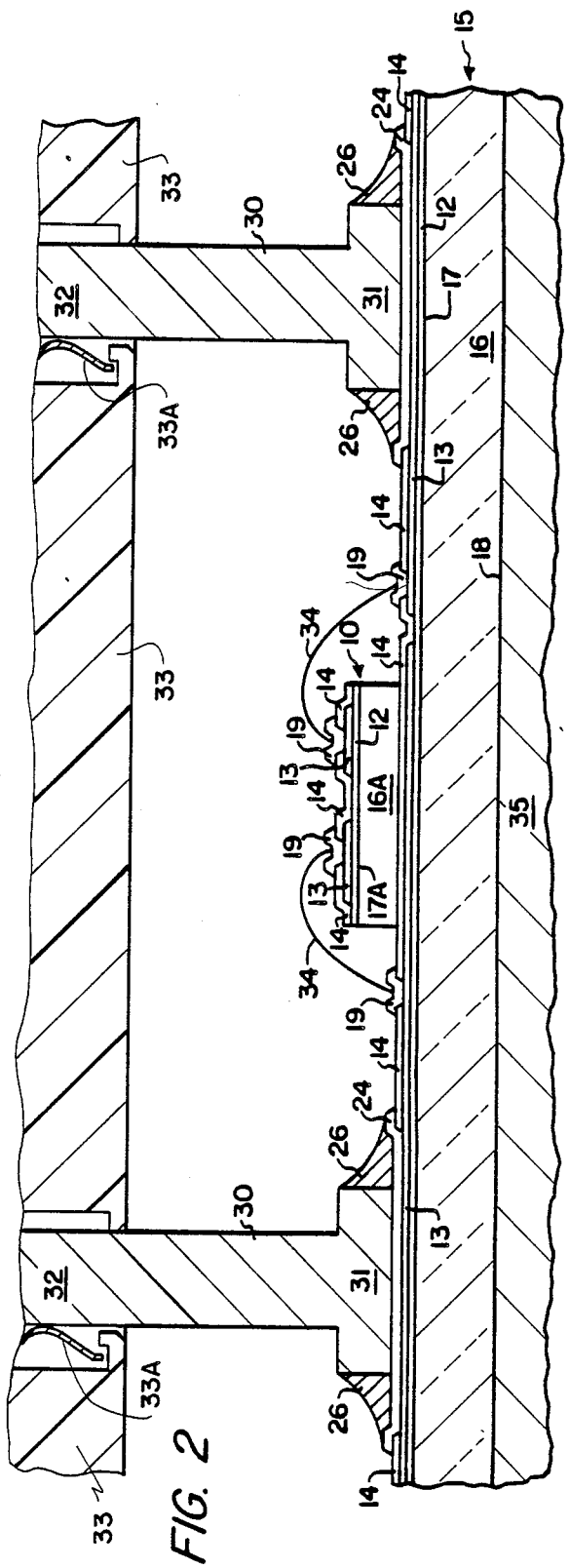
FIG. 2 illustrates a semiconductor substrate or chip carrier having an integrated circuit chip wire bonded to the substrate and pins attached by their first ends to the semiconductor substrate in accordance with the present invention. The second end of the pins are shown mated to a pin-grid socket. The semiconductor substrate or chip carrier is shown attached to a heat sink.

FIGS. 1, 2 and 4 illustrate semiconductor structures 15 which as described here each comprise a semiconductor body 16 having a first surface 17 which is covered by a dielectric layer 12. Electrical contacts or interconnects 13 are patterned onto layer 12, and a passivating dielectric layer 14 covers portions of interconnects 13 and dielectric layer 12. Contact pads or metalization interconnects 19 which are adapted to be connected to an integrated circuit chip are formed through vias in dielectric layer 14 so that electrical contact is made with metalization interconnects 13. In FIGS. 1 and 2, a heat sink 35 is also shown attached to a second surface 18 of semiconductor body 16.

Terminal pins 30 are shown attached to semiconductor structure 15, each pin having a first end 31 connected to semiconductor structure 15 in accordance with the present invention as briefly described here and as further described below. In the embodiments shown, first ends 31 of each pin are shown mated to metalization interconnects or interface metalizations 24 by a metalized material 26 which is reflowed around the first end 31 of each pin 30. Each metalization interconnect 24 is in electrical contact with a corresponding metalization interconnect 13. Because metalization interconnects 19 are also in electrical contact with metalization interconnects 13, there is electrical continuity between metalization interconnects 19 and pins 30. Thus, when the second end 32 of each pin 30 is mated with a pin-grid socket 33, apparatus comprising socket 33 is in immediate electrical contact with whatever input/output device is ultimately mated with metalization interconnects 19.

Figure 5:
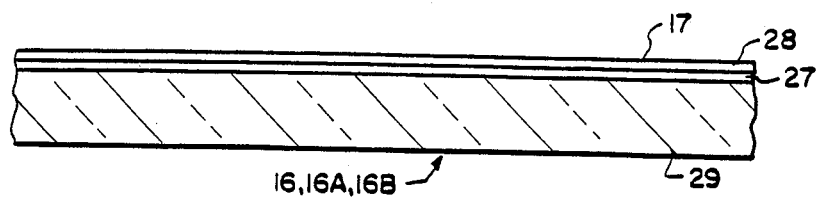
FIG. 5 illustrates that substrates or chip carriers and integrated circuit chips having pins attached to them in accordance with the present invention may comprise layers of semiconductor material.

FIG. 5 illustrates that semiconductor body 16 may contain layers of varying semiconductor material. While semiconductor body 16 may typically be silicon alone, semiconductor body 16 may comprise layers such as 27, 28 and 29, each layer comprising a semiconductor material selected from a group such as a silicon, germanium, gallium arsenide and mercury cadmium telluride.

As was previously indicated, metalization interconnects 19 (sometimes also referred to as contact pads or interface metalizations) are adapted to be connected to an integrated circuit chip. FIGS. 1 and 2 illustrate attachment of an integrated circuit chip 10 to metalization interconnects 19 by flip-chip bonding (FIG. 1) and wire bonding (FIG. 2).

Integrated circuit chip 10 as illustrated here comprises a semiconductor body 16A typically comprising integrated circuitry and having a first surface 17A covered by a dielectric layer 12. Overlying dielectric layer 12 is a tier of electrical conductors or interconnects 13, which in turn are connected to contact pads or metalization interconnects 19 through vias in a dielectric layer 14. Dielectric layer 14 covers the remainder of metalization interconnects 13 and dielectric layer 12, thus providing a passivating and insulating layer.

In FIG. 1, integrated circuit chip 10 is shown flip-chip bonded to semiconductor structure 15 by solder bumps 23 which are reflowed to form good mechanical and electrical bonds between juxtaposed contact pads 19 on the integrated circuit chip 10 and substrate 16.

FIG. 2 illustrates integrated circuit chip 10 having wire bonded connections 34 between contact pads or metalization interconnects 19 on the integrated circuit chip 10 and semiconductor substrate 16.

FIG. 3 illustrates an integrated circuit chip 10B having terminal pins 30 attached by their first ends 31 to chip 10B in accordance with the present invention. FIG. 3 also shows the second end 32 of pins 30 mated to pin-grid socket 33, thus providing direct electrical connection between integrated circuit chip 10B and apparatus comprising socket 33 without the use of an intermediate package. A heat sink 35 is also shown attached to a second surface 18B of integrated circuit chip 10B.

Integrated circuit chip 10B as illustrated here comprises a semiconductor body or substrate 16B typically including integrated circuitry and having a first surface 17B covered by a dielectric layer 12. Overlying dielectric layer 12 is a tier of electrical conductors or metalization interconnects 13 which in turn is covered in part by a dielectric material 14 thus providing a passivating and insulating layer. Metalization interconnects or interface metalizations 24 are also attached to metalization interconnects 13 through vias in dielectric layer 14, each metalization interconnect 24 being used to attach a terminal pin 30 by its first end 31 to integrated circuit chip 10B in accordance with the present invention. Each metalization interconnect 13 is not only electrically and physically connected to a metalization interconnect 24 and in turn, to a terminal pin 30, but is also interconnected to an input/output terminal within the integrated circuitry of semiconductor body or substrate 16B. Thus, a direct connection may be made between the integrated circuitry within circuit chip 10B and apparatus comprising a pin-grid socket 33 to which terminal pins 30 may be connected.

As with semiconductor body or substrate 16, semiconductor bodies or substrates 16A or 16B may consist either of a single semiconductor material such as silicon, or may consist of semiconductor layers such as 27, 28 and 29, each layer being selected from the group such as silicon, germanium, gallium arsenide and mercury cadmium telluride.

The fabrication of semiconductor structures shown herein will now be described as though implemented in conjunction with silicon based technology, it being recognized that if a semiconductor material in addition to or other than silicon is to be used, alternate technology compatible with the other semiconductor materials would be employed.

Dielectric layer 12 may be of any dielectric material commonly used with silicon. Examples of acceptable dielectrics are silicon dioxide, silicon nitride, and polyimide. Typically, silicon dioxide is used. Silicon dioxide may be formed into layer 12 by known techniques of thermal oxidization or pyrolytic deposition. Typically layer 12 would be about one micron thick.

As has been previously indicated, overlying dielectric layer 12 is a tier of electrical conductors or metalization interconnects 13. Typically tier 13 would be of aluminum. Tier 13 is produced by depositing a layer of aluminum, typically one-half to one micron thick, on dielectric layer 12. A coating of photoresist is applied to the exposed surface of the aluminum. The photoresist is then exposed and developed, leaving a coating of resist covering the portions of the layer of aluminum to be retained in the next etching step. The aluminum is then subjected to an etchant which removes the desired portion of the aluminum layer and leaves the desired patterns of metalization interconnects; i.e., tier 13. The remaining photoresist is then striped away.

A layer of dielectric material 14 is then deposited over the metalization interconnects within tier 13, thus providing a passivating and insulating layer. As with dielectric layer 12, dielectric layer 14 may be of various materials such as silicon dioxide, silicon nitride, or polyimide. The typical thickness of dielectric layer 14 is about one micron.

Vias are then typically formed in dielectric layer 14 by means of a photoresist and etching process. The vias expose electrical interconnects 13 and permit placement of electrical interconnects or interface metalizations 19 and 24 in electrical connections with electrical interconnects 13.

It should be noted that, in the embodiments shown, only one tier of metalization interconnects 13 are shown. The present invention is not limited to such a single layer of metalization interconnects 13. Additional tiers of metalization interconnects and layers of dielectric materials may be included as necessary for the specific purposes at hand. The number of tiers of metalization interconnects required will be determined by the nature of the integrated circuit chips or substrates and the types of electrical connections desired to be made between or within the integrated circuit chips and substrates.

It should also be noted that integrated circuit chips 10 and 10B include active circuit elements (not shown) and that vias (now shown) in dielectric layer 12 would connect these circuit elements to the various metalization interconnects 13 in one or more tiers as discussed above. Likewise, semiconductor chip carriers or substrate assemblies 15 may comprise active circuit elements and similar interconnects to metalization interconnects 13.

Figure 6:
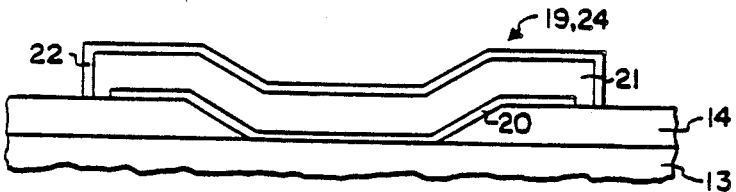
FIG. 6 illustrates metalization interconnects compatible with the present invention.

Metalization interconnects or interface metalizations 19 and 24 are typically formed as more particularly shown in FIG. 6. Each metalization interconnect 19 and 24 typically consists of three layers of metal. A first layer 20 is of a material which adheres well to the dielectric chosen for dielectric layer 14. If dielectric layer 14 is of silicon dioxide, chromium may be used for layer 20. Typically layer 20 would be approximately 1000 angstroms thick. A metal chosen for its good electrical conductivity and its solderability, typically copper, forms layer 21. Typically layer 21 has a thickness of about one to two microns A thin layer 22 of gold then covers copper layer 21. Gold layer 22 helps to prevent oxidization of the copper. Typically gold layer 22 is about 1000 angstroms thick.

As an alternative to the chrome-copper-gold structure described above, other structures may be used for metalization interconnects 19 and 24. Examples of other metalization interconnects are titanium-platinum-gold, titanium-palladium-gold, and titanium-tungsten-cobalt-gold.

The attachment of integrated circuit chip 10 to semiconductor structure 15 can be by any of several means. Examples shown include flip-chip bonding (FIG. 1) and wire bonding (FIG. 2). With the present invention, the approach of flip-chip bonding, also sometimes called controlled collapse solder reflow, is preferred since substantially the same process may be used to connect terminal pins 30 to semiconductor bodies in accordance with the present invention. In addition, flip-chip bonding allows electrical connections to be made between substrates 16 and integrated circuit chip 10 in the region immediately between the two rather than requiring additional space on the substrate surface as would be required in other bonding techniques such as the wire bonding illustrated in FIG. 2. Another advantage of the controlled collapse solder bonding technique is that the use of this method allows most or all of the electrical connections between substrate 16 and chip 10 to be formed simultaneously (and as previously noted, concurrently with attaching terminal pins), thereby providing advantages in lower processing time and greater bond reliability as compared with most other bonding techniques.

In order to use the preferred method of bonding flip-chip 10 to substrate 16 as shown in FIG. 1, at least some of the contact pads or metalization interconnects 19 on each of the semiconductor substrates 16 and circuit chip 10 must be arranged in a pattern which matches the pattern of the contact pads or metalization interconnects 19 on the other of the substrate and chip. If desired, some of the metalization interconnects 19 may be reserved for later wire bonding in order to provide additional electrical connections, such as for later electrical connections to a second level substrate if such connections are required in the particular application.

Part of the process of electrically and mechanically securing substrate assembly 15 to chip 10 with solder bumps 23 and typically to form the solder bumps on contact pads 19 of either substrate 15 or integrated circuit 10. Solder, typically five percent tin and ninety-five percent lead, is typically deposited through an aperture mask to a depth of about fifty microns on each contact pad 19 which is to be used in this bonding step. Substrate assembly 10 is then typically heated to about three-hundred forty degrees centigrade in a nitrogen atmosphere in order to reflow the solder and to form it into approximately spherical solder bumps 23.

Following the formation of solder bumps 23, integrated circuit chips 10 are positioned on substrate assembly 15 in such a manner that appropriate contact pads 19 on chips 10 are aligned to appropriate contact pads 19 on substrate assembly 15. The entire assembly, including substrate assembly 15 and integrated circuit chip 10, are then typically heated to approximately three-hundred forty degrees centigrade in a nitrogen atmosphere. This reflows the solder and forms good mechanical and electrical bonds between each integrated circuit chip 10 and substrate assembly 15. Note that while FIG. 1 illustrates only one integrated circuit chip attached to substrate assembly 15, the present invention is not limited to connection of one integrated chip. A plurality of integrated circuit chips are typically attached to substrate assembly 15; see, for example, FIG. 7.

As has previously been indicated, terminal pins 30 may be attached to substrate assembly 15 at the same time as integrated circuit chip 10 is flip-chip bonded to substrate assembly 15. Alternately, pins 30 may be attached to a substrate assembly 15 in a separate process without having an integrated circuit chip attached to substrate assembly 15. In the latter case, an embodiment such as shown in FIG. 4 will result. The substrate assembly shown in FIG. 4 is adapted to be connected to an integrated circuit chip; once a chip is mounted to the FIG. 4 assembly, the assembly would be ready to insert into a pin-grid socket 33.

The size of metalization interconnects 19 and 24 may vary depending upon particulars of an application. Typically, if another chip is to be attached by solder reflow, solder bumps 23 and metalization interconnects 19 would have a diameter on the order of four to six thousandths of an inch. Metalization interconnects or interface metalizations 24 for connecting terminal pins are typically in the neighborhood of twenty to forty thousandths of an inch in diameter. Terminal pins 30 typically have a diameter in the range of eight to twenty thousandths of an inch and typically have an enlarged shoulder at their first ends 31 having a diameter approximately double that of the pin itself. The typical length of pins 30 is on the order of two hundred thousandths of an inch. The typical center-to-center placement of pins 30 is discussed further below.

In order to connect pins 30, metalization interconnects or interface metalizations 24 can be solder bumped as previously described in connection with metalization interconnects 19. Other options include deposition of solder by screen printing, by placement in a fixture, or by plating.

During the attaching process, pins 30 may be held in a graphic fixture having holes in which the pins have been inserted. The holes in the graphite fixture are pre-drilled corresponding to the pin array pattern required on the semiconductor body. Pins are inserted in the fixture, typically being held in place by the enlarged shoulders 31. Solder preforms are then typically placed on shoulders 31. The fixture is fitted to the semiconductor body so that the proper orientation between the first ends 31 of the pins 30 and the metalization interconnects 24 are obtained. The fixture and substrate assembly 15 or integrated circuit chip 10B are then heated in an atmosphere above the melting point of the solder typically using a process substantially consistent with that described previously in connection with reflowing solder bumps 23. After cooling, the graphite fixture is then removed, leaving the pinned semiconductor body The reflow of the solder around the first end 31 of pin 30 typically results in a fillet shape of solder 26 around the first end 31 of each pin.

Several different solders and brazes can be used in attaching pins 30 to semiconductor assemblies in accordance with the present invention. The present invention has been successfully implemented with tin-lead solder and nickel plated Kovar pins 30. In addition to the composition previously mentioned, a composition of sixty percent tin and forty percent lead may be used. In addition, tin silver solder in a combination of ninety-five percent tin and five percent silver may be used. Other combinations are also possible.

Figure 7:
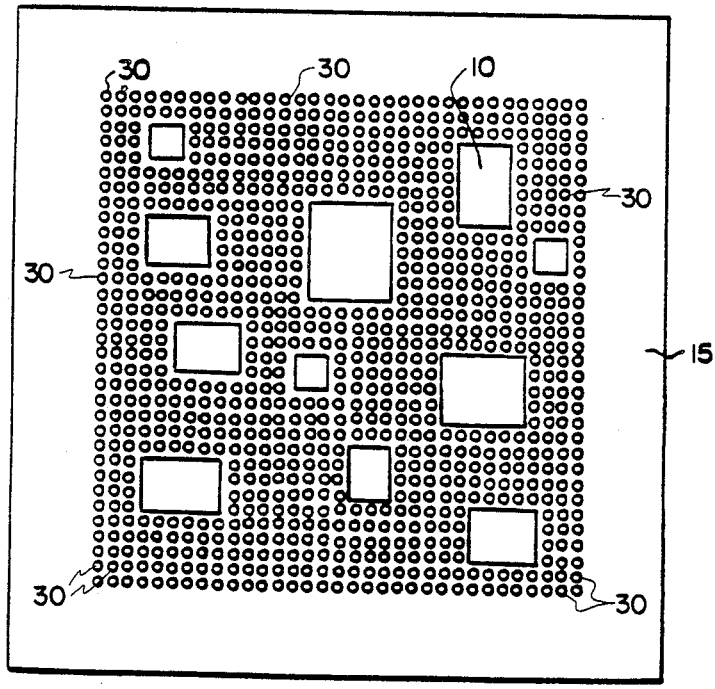
FIG. 7 illustrates a typical array of pins attached to a semiconductor chip carrier in accordance with the present invention. A plurality of integrated circuit chips are also shown attached to the semiconductor chip carrier.

The preferred arrangement of pins 30 is to place them in an array so that they can be removably inserted into an industry-standard pin-grid socket. One such array of pins 30 is illustrated in FIG. 7. At the present time, most industry-standard pin-grid sockets 33 have contacts 33A arranged in a square array with contacts 33A spaced to accept pins 30 having a center-to-center spacing of one hundred thousandths of an inch; pin-grid arrays having center-to-center spacings of fifty thousandths of an inch are also becoming an industry standard, and other industry-standard arrays may arise in the future.

It is, of course, not necessary to use industry-standard arrays. One may design an array and a pin-grid socket having an arrangement or center-to-center spacings which are not industry standard.

At the current time, pin-grid socket arrays are available as both zero-insertion force (ZIF) sockets as well as low-insertion force (LIF) sockets. A zero-insertion force socket permits insertion of pins 30 into the ZIF socket using substantially zero force, and a lever or other mechanism is then activated so that each pin 30 is firmly grasped. One such ZIF socket is illustrated in U.S. Pat. No. 3,763,459. Low-insertion force sockets simply permit the insertion pins 30 into the pin-grid socket by use of a small amount of force, pins 30 being held into the LIF socket by friction. In either case, assemblies comprising the present invention can be easily removed from the sockets. In the case of the ZIP socket, the lever or other mechanism is released, and apparatus comprising the present invention is removed by simply lifting the assembly out of the socket. In the case of an LIF socket, apparatus comprising the present invention is removed by pulling the assembly out of the socket using a small amount of force. Either form of pin-grid socket is available in many configurations from vendors such as Textool, AMP, and Wells Electronics.

The present invention has many advantages. As previously indicated, by using the present invention, the intermediate package typically used to package a semiconductor body is eliminated Therefore, a silicon or other semiconductor chip can be directly interfaced with a tester comprising a pin-grid socket or with any other system comprising a pin-grid socket. Since the intermediate package is eliminated, electrical line length is substantially reduced, thus substantially reducing delay times within and between circuits. In addition, the present invention eliminates thermal expansion mismatch between, for example, ceramic or plastic packages and the semiconductor body. The present invention is also compatible with direct cooling of semiconductor chip carriers or substrates and integrated circuit chips.

The embodiments of the invention in which an exclusive property or right is claimed are defined as follows:

1. An integrated circuit semiconductor package comprising:
   a semiconductor body having a first surface, the semiconductor body serving as a substrate, the substrate being connected to an integrated circuit chip, wherein the integrated circuit chip is flip-chip bonded to the substrate;
   a plurality of pins, each pin having first and second ends; and
   means for connecting the first end of each pin to the first surface on the semiconductor body to result in a bond between them so that the semiconductor supports the pins oriented outward from the substantially perpendicular to the first surface, the means for connecting comprising a plurality of metallization interconnects, adapted to be connected to the integrated circuit chip, with there being a metallization interconnect interspaced between the first end of each pin and the first surface of the semiconductor body, the pins being arranged in an array and free of any other supports bonded thereto, and the interconnect being of sufficient strength so that the second end of each pin can be removably inserted into a pin-grid socket.

2. The apparatus of claim 1 wherein at least one of the substrate and the integrated circuit chip comprises silicon.

3. The apparatus of claim 1 wherein both the substrate and the integrated circuit chip comprises the same semiconductor material.

4. The apparatus of claim 1 wherein at least one of the substrate and the integrated circuit chip comprises layers of semiconductor material selected from the group consisting of silicon, germanium, gallium arsenide and mercury cadmium telluride.

5. An integrated circuit semiconductor package comprising:
   a semiconductor body having a first surface, the semiconductor body serving as a substrate, the substrate being connected to an integrated circuit chip, wherein the integrated circuit chip is wire bonded to the substrate;
   a plurality of pins, each pin having first and second ends; and
   means for connecting the first end of each pin to the first surface on the semiconductor body to result in a bond between them so that the semiconductor supports the pins oriented outward from the substantially perpendicular to the first surface, the means for connecting comprising a plurality of metallization interconnects, adapted to be connected to the integrated circuit chip, with there being a metallization interconnect interspaced between the first end of each pin and the first surface of the semiconductor body, the pins being arranged in an array and free of any other supports bonded thereto, and the interconnect being of sufficient strength so that the second end of each pin can be removably inserted into a pin-grid socket.

6. The apparatus of claim 5 wherein at least one of the substrate and the integrated circuit chip comprises silicon.

7. The apparatus of claim 5 wherein both the substrate and the integrated circuit chip comprise the same semiconductor material.

8. The apparatus of claim 5 wherein at least one of the substrate and the integrated circuit chip comprises layers of semiconductor material selected from the group consisting of silicon, germanium, gallium arsenide and mercury cadmium telluride.

* * * * *